(12) United States Patent
Singrigowda et al.

(10) Patent No.: US 12,231,120 B1
(45) Date of Patent: Feb. 18, 2025

(54) APPARATUS, SYSTEM, AND METHOD FOR IMPROVING LATENCY OR POWER CONSUMPTION

(71) Applicant: Advanced Micro Devices, Inc., Santa Clara, CA (US)

(72) Inventors: Jagadeesh Anathahalli Singrigowda, Bengaluru (IN); Girish A S, Bengaluru (IN); Aniket Bharat Waghide, Bengaluru (IN); Prasant Kumar Vallur, Bengaluru (IN)

(73) Assignee: Advanced Micro Devices, Inc., Santa Clara, CA (US)

( * ) Notice: Subject to any disclaimer, the term of this patent is extended or adjusted under 35 U.S.C. 154(b) by 65 days.

(21) Appl. No.: 17/855,562

(22) Filed: Jun. 30, 2022

(51) Int. Cl.
| | |
|---|---|
| *H03K 19/00* | (2006.01) |
| *G06F 1/3203* | (2019.01) |
| *G06F 1/3212* | (2019.01) |
| *G06F 1/3234* | (2019.01) |
| *G06F 1/3296* | (2019.01) |
| *G06K 15/00* | (2006.01) |
| *H03K 3/037* | (2006.01) |
| *H03K 19/17736* | (2020.01) |

(52) U.S. Cl.
CPC ....... *H03K 19/0016* (2013.01); *G06F 1/3203* (2013.01); *G06F 1/3212* (2013.01); *G06F 1/3234* (2013.01); *G06F 1/3296* (2013.01); *G06K 15/4055* (2013.01); *H03K 3/037* (2013.01); *H03K 19/17744* (2013.01)

(58) Field of Classification Search
CPC . H03K 19/0016; G06F 1/3203; G06F 1/3212; G06F 1/3234; G06F 1/3296; G06K 15/4055

See application file for complete search history.

(56) References Cited

U.S. PATENT DOCUMENTS

| | | | |
|---|---|---|---|
| 2008/0082847 A1* | 4/2008 | Lee | G06F 1/3203 713/323 |
| 2014/0075066 A1* | 3/2014 | Menard | G06F 1/3243 710/104 |
| 2020/0341537 A1* | 10/2020 | Samson | G06F 1/28 |
| 2022/0200584 A1* | 6/2022 | Pirozzi | G05F 1/46 |

* cited by examiner

*Primary Examiner* — Phil K Nguyen
*Assistant Examiner* — Gayathri Sampath
(74) *Attorney, Agent, or Firm* — Greenberg Traurig, LLP (57) ABSTRACT

A disclosed method for improving latency or power consumption may include (i) receiving, at a power-state processing circuit, a power-state signal indicating whether a processing unit is entering a low-power-state, (ii) transmitting, in response to the power-state signal indicating that the processing unit is entering the low-power-state, a control signal from the power-state processing circuit to a latching circuit, and (iii) storing, by the latching circuit and in response to the control signal, a state of an input/output pad that is coupled to the processing unit. Various other apparatuses, systems, and methods are also disclosed.

20 Claims, 10 Drawing Sheets

APPARATUS, SYSTEM, AND METHOD FOR IMPROVING LATENCY OR POWER CONSUMPTION

BACKGROUND

In the modern computing marketplace, processing units such as central processing units may sometimes enter a low-power mode. For example, the low-power mode may correspond to a sleep mode. Nevertheless, as described much further in the detailed description section below, usage of the low-power mode may not be optimized in terms of latency or power consumption. The instant disclosure, therefore, identifies and addresses a need for additional and improved apparatuses, systems, and methods for improving latency or power consumption.

SUMMARY

As will be described in greater detail below, the instant disclosure generally relates to apparatuses, systems, and methods for improving latency or power consumption. In one example, a corresponding method may include (i) receiving, at a power-state processing circuit, a power-state signal indicating whether a processing unit is entering a low-power-state, (ii) transmitting, in response to the power-state signal indicating that the processing unit is entering the low-power-state, a control signal from the power-state processing circuit to a latching circuit, and (iii) storing, by the latching circuit and in response to the control signal, a state of an input/output pad that is coupled to the processing unit.

In some examples, the low-power-state includes a sleep mode of the processing unit, receiving the power-state signal includes receiving the power-state signal from a sleep mode indicator, the sleep mode indicator is disposed within a power evaluation circuit that determines whether each of a set of multiple power sources is available, and storing the state of the input/output pad enables the state to be retrieved from the latching circuit upon the processing unit switching from the sleep mode to an active mode.

In further examples, the power evaluation circuit includes a counter block and a counter bypass block, signals from the set of multiple power sources are input to an and gate that is coupled to the counter block, and a bypass instruction signal is input to the counter bypass block to enable bypassing the counter block. In some examples, an output of the counter block and an output of the counter bypass block are connected as inputs to an or gate.

In further examples, the power-state processing circuit includes a second latching circuit, the second latching circuit accepts a first signal to set the second latching circuit, the first signal indicating whether each of a set of multiple power sources is available, and the second latching circuit accepts a second signal to reset the second latching circuit, the second signal indicating whether a specific voltage power source is available.

In further examples, the second latching circuit generates an output that is connected as an input to an and gate that generates the control signal for operating the latching circuit, and the power-state processing circuit inverts the control signal to create a second control signal for further operating the latching circuit.

In further examples, assertion of the output of the second latching circuit disables at least one programmable pin that is coupled to the input/output pad.

In some examples, the latching circuit includes a first latch for storing an enabling signal, and the latching circuit comprises a second latch for storing a data signal that corresponds to the enabling signal.

In some examples, the power-state processing circuit and the latching circuit are disposed on a general-purpose input/output, the general-purpose input/output includes a first voltage domain and a second voltage domain, and the general-purpose input/output includes a driver that converts an output from the first voltage domain to the second voltage domain.

In further examples, performing the method enables the input/output pad to return to tracking a data signal within about 20 microseconds of the processing unit switching from a sleep mode to an active mode.

A corresponding device may include (i) a power-state processing circuit that receives a power-state signal indicating whether a processing unit is entering a low-power-state and (ii) a latching circuit that couples the processing unit to an input/output pad and that responds to the power-state signal indicating that the processing unit is entering the low-power-state by storing a state of the input/output pad.

A corresponding system may include (i) a processing unit, (ii) a power evaluation circuit that determines whether each of a set of multiple power sources is available and generates a power-state signal, and (iii) a general-purpose input/output that includes (a) a power-state processing circuit that receives the power-state signal indicating whether a processing unit is entering a low-power-state and (b) a latching circuit that couples the processing unit to an input/output pad and that responds to the power-state signal indicating that the processing unit is entering the low-power-state by storing a state of the input/output pad.

Features from any of the above-mentioned embodiments may be used in combination with one another in accordance with the general principles described herein. These and other embodiments, features, and advantages will be more fully understood upon reading the following detailed description in conjunction with the accompanying drawings and claims.

BRIEF DESCRIPTION OF THE DRAWINGS

The accompanying drawings illustrate a number of exemplary embodiments and are a part of the specification. Together with the following description, these drawings demonstrate and explain various principles of the instant disclosure.

Throughout the drawings, identical reference characters and descriptions indicate similar, but not necessarily identical, elements. While the exemplary embodiments described herein are susceptible to various modifications and alternative forms, specific embodiments have been shown by way of example in the drawings and will be described in detail herein. However, the exemplary embodiments described herein are not intended to be limited to the particular forms disclosed. Rather, the instant disclosure covers all modifications, equivalents, and alternatives falling within the scope of the appended claims.

DETAILED DESCRIPTION OF EXEMPLARY EMBODIMENTS

The present disclosure describes various apparatuses, systems, and methods for improving latency or power consumption. Generally speaking, the technology of this application may improve the ability of a computing component, such as a general purpose or special purpose input/output, to retain a state of a pad throughout a central processing unit sleep and wake cycle. The technology may also improve the latency involved in the central processing unit switching from the sleep mode to an active mode, and this latency may be reduced from about four milliseconds to about 20 microseconds. The technology of this application may achieve these benefits by supplementing general-purpose input/outputs with state retention components, such as one or more latching circuits. Additionally, the state retention components on the general-purpose input/outputs may coordinate with a sleep mode indicator that alerts the state retention components to begin using the one or more latching circuits to retain a state of the pad of the general-purpose input/outputs (without these components the general-purpose input/outputs may generally lack the state retention functionally that is described further below). The sleep mode indicator may be embedded within a power evaluation circuit that evaluates whether each one of a set of multiple power sources has become available.

The following provides some background information regarding the context in which the technology of this application may provide the multiple benefits that are outlined above. Today's high-performance processors have stringent power requirements. To save power when a central processing unit ("CPU") is idle, the CPU may enter a low power mode. A CPU may have several power modes collectively (e.g., "Z-states"), and these power modes can be widely categorized as Z0, Z1, Z3, Z6 & Z7 states in certain embodiments. Although this description here refers to different power modes as Z-states such as Z0 and Z1, other embodiments may use different labels or verbiage to describe substantially similar configurations.

In the Z0 state (active/normal mode), the CPU is in normal functional mode and it executes all indicated instructions and consumes the highest power. In the Z1 and Z3 states (idle mode), clock-gating techniques are used to reduce power consumption. In these modes, the CPU does not execute any instructions and the CPU can come back from idle mode to normal mode with less latency. In the Z6 and Z7 states (sleep mode): supply voltages are decreased or shut down to reduce further power to save more energy.

As we enter the deeper states that are associated with one or more sleep modes, it is desirable to conserve more power. However, it takes more time for the CPU to come back from the sleep mode to the normal mode. This means longer wakeup time. Hence, there is a trade-off between power and latency in cutting edge high-computing processors. There is an immense competition in the silicon industry to reduce power and latency simultaneously without compromising on the efficiency and performance of processors. When the CPU goes into a sleep mode from the normal mode in order to save power, existing data may be stored and when the CPU comes back to the normal mode from the sleep mode, the input/outputs associated with the CPU should start from where the input/outputs had stopped quickly. Faster transition means lower latency.

Input/output interfaces (i.e., input/outputs, whether general purpose or special purpose) enable the CPU to communicate with the external world. Accordingly, in view of the latency or power consumption demands that are outlined above, it is desirable to design these input/outputs to support a state retention feature whereby the state of the pad may be retained throughout a sleep and wakeup cycle. This means that a particular input/output should retain the state of data (e.g., a bit value) when it transits to the sleep mode and should support faster data restore during wakeup.

Figure 1:
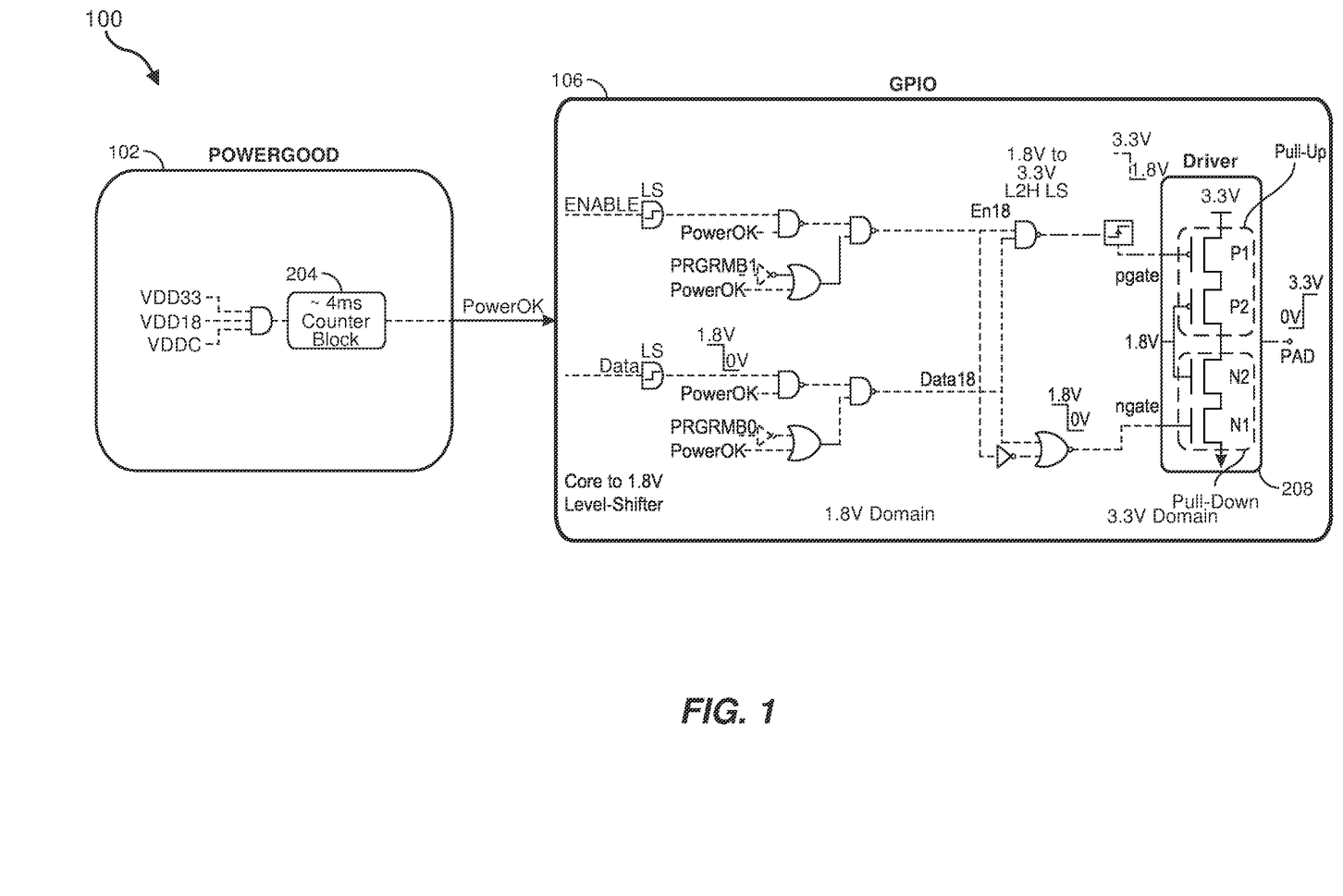
FIG. 1 is a circuit diagram for a suboptimized general-purpose input/output.

FIG. 1 shows an illustrative circuit diagram 100 for a suboptimized general-purpose input/output and its coordination with a power evaluation circuit or macro (e.g., "POWERGOOD" in FIGS. 1-10). To ensure glitch-free transmission of data, the input/output should receive a signal (e.g., "PowerOK" in the examples of the figures) that indicates that all power supplies of interest are stable, and therefore the input/output can transmit or receive the data seamlessly to and from the chip. The PowerOK signal is generally generated by the power evaluation circuit or macro, which provides a ready signal when all supplies are up and stable.

When input/outputs are placed as a cluster, these clusters may include different components, such as general-purpose input/outputs ("GPIO"s), the power evaluation circuit generating the PowerOK signal, electrostatic sensitive devices, termination input/outputs, and so on to assist distinctive voltage domain signaling.

GPIOs are designed to transmit and receive data from a core CPU to the external world and vice-versa. GPIOs can accept core inputs on data and enable pins when the core supply is available. In the absence of core supply and the presence of a first supply (e.g., "VDD18" for 1.8V power) and a second power supply (e.g., "VDD33" for 3.3V power), the pad of the GPIOs will be controlled by 1.8V signals on programmable pins (e.g., "PRGRMB1" and "PRGRMB0" bits in FIG. 1) These GPIOs have additional features such as enabling of controlled data transmission, level-shifting logic to avoid electrical stress on the devices, pre-driver and core-domain circuitry that includes level-shifting blocks to translate core domain logic to a 3.3V domain, dedicated PMOS and NMOS driver paths to reduce short circuit current, a 3.3V pull-up and pull-down driver device to assist 3.3V pad signaling, and defining the pad state to a known state, such as high, low, or hi-Z, in the absence of the core supply (e.g., which may be referred to as "cold boot," as further discussed below).

The power evaluation circuit (e.g., "POWERGOOD" in FIG. 1) that generates the PowerOK signal may include power sniffers, level shifters, and delay logic elements to sense all the relevant power supplies, which may include VDD33 (3.3V power supply), VDD18 (1.8V power supply), and VDDC (core power supply). Once the power supplies are up and stable, the internal delay logic of the power evaluation circuit, which may include a ring oscillator and a counter, ensures the assertion of PowerOK, which may correspond to a 1.8V domain signal after a particular delay of about four milliseconds. A delayed PowerOK output generated by the POWERGOOD block is provided as an input to the GPIOs in an input/output cluster. This signal ensures glitch free operation of the GPIOs. As further shown in FIG. 1, the power evaluation circuit may be configured such that PowerOK (1.8V) will be high when all the supplies are stable, and PowerOK will be low if any one of the supplies is low.

Figure 2:
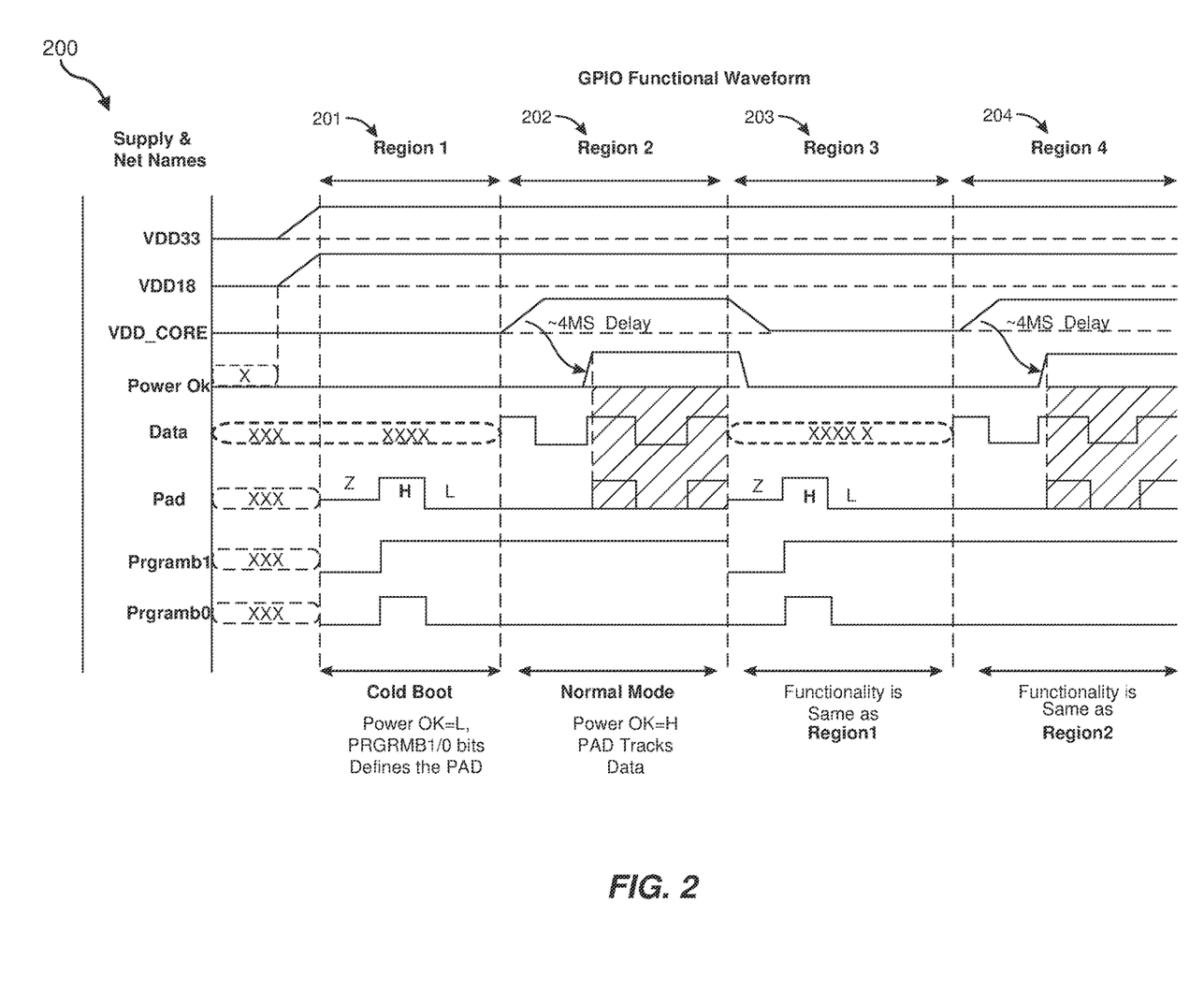
FIG. 2 is a waveform diagram corresponding to operation of the suboptimized general-purpose input/output through multiple power modes.

FIG. 2 shows an illustrative example of a waveform diagram 200 that corresponds to operation of the suboptimized GPIO of FIG. 1. This figure is divided into a first region 201, a second region 202, a third region 203, and a fourth region 204. The first region may correspond to a cold boot scenario in which the computing device is booting up from a powered off state. The second region may correspond to the normal mode or active mode of the computing device. The third region may correspond to the sleep mode of the computing device, during which operation of the various signal lines (e.g., the "Supply & Net Names" shown in FIG. 2) may operate substantially the same as in the first region, as further illustrated in this figure. Lastly, the fourth region may correspond to operation of the GPIO when returning to the active mode (as in the second region) upon waking up from the sleep mode of the third region.

To elaborate, the first region where input/output supplies (i.e., VDD33 and VDD18) are present and the core supply (i.e., VDD_CORE) is absent during boot-up is referred to as a "cold boot" scenario. In the first region, VDD33 and VDD18 supplies are stable, but VDD_CORE is low. Hence, PowerOK signal is low, the data and associated ENABLE signal (see FIG. 1) lose control of the GPIO and the GPIO pad will instead be defined by the PRGRMB1 and PRGRMB0 bits. If PRGRMB1=0V and PRGRMB0=0V, then this makes EN18=0V, pgate=3.3V, Data18=0V and ngate=0V (see FIG. 1), hence both of the pull-up and pull-down drivers are OFF, and now the pad of the GPIO will be defined to hi-Z. This is shown in the first portion of the first region in FIG. 2, where the pad signal is held to hi-Z.

In contrast, if PRGRMB1=1.8V and PRGRMB0=1.8V, this makes EN18=1.8V, pgate=1.8V, Data18=1.8V, and ngate=0V, such that the pull-up driver is ON and pull-down driver is OFF, and the pad of the GPIO will be defined to 3.3V which is high. This is shown in the second portion of the first region in FIG. 2, where the pad signal is held to high.

Similarly, if PRGRMB1=1.8V and PRGRMB0=0V, this makes EN18=1.8V, pgate=3.3V, Data18=0V and ngate=1.8V, hence the pull-up driver is OFF and the pull-down driver is ON, such that the pad of the GPIO will be defined to 0V which is low. This is shown in the third portion of the first region in FIG. 2, where the pad signal is held to low. For completeness, in another scenario PRGRMB1=0V and PRGRMB0=1.8V, but this is a case that should not be used.

In the second region corresponding to the normal mode or active mode, once VDD_CORE is up, then PowerOK is asserted after about four milliseconds of delay from the POWERGOOD macro and then the GPIO pad follows the ENABLE and data input. If ENABLE=0V, EN18=0V, pgate=3.3V, and ngate=0V, then the pad of the GPIO will be defined to hi-Z. If ENABLE=0.75V, data=0V, then pgate=3.3V and ngate=1.8V, hence the pull-up driver is OFF and the pull-down driver is ON and the pad of the GPIO is pulled to low. In contrast, if data=0.75V, then pgate=1.8V and ngate=0V, and hence the pull-up driver is ON and the pull-down driver is OFF, and the pad of the GPIO is pulled to high.

In the third region, the processor enters a sleep mode with VDD33 and VDD18 supplies being stable and VDD_CORE is pulled low to save power. This means PowerOK will go low, and since PowerOK=low, the pad will be defined to low, high, or hi-Z by using the PRGRMB1 and PRGRMB0 bits. Functionality in this region is substantially the same as the first region. As there is no sequential logic implemented in the existing GPIO (or other I/O interface) to retain the state of the data signal during the sleep mode, the pad does not hold this state before going into the sleep mode to support a deeper Z-state, as further discussed above.

In the fourth region corresponding to the normal mode or active mode upon waking up from the sleep mode of the third region, once VDD_CORE is asserted back, PowerOK will be asserted high again after about four milliseconds of delay. Due to non-availability of a faster save/restore feature (which is discussed further below in connection with FIGS. 3-10), the pad of the GPIO follows the data signal after about four milliseconds of delay, which is essentially the same delay as in the second region when the computing device emerges into the normal mode following the cold boot region. The expectation from this fourth region is that the PowerOK signal should have asserted sooner to support faster save/restore functionality of the CPU during the transition from the sleep mode to the normal mode. Instead, the data signal will be transmitted to the pad only after about four milliseconds of delay and hence there is significant latency in the data path.

In view of the above, it would be beneficial to address one or more of the problems outlined above in certain GPIO architectures. An improved version of these GPIO architectures should retain the previous state of the data signal on the pad when the CPU enters the sleep mode. Similarly, the improved version of these GPIO architectures should restore the state of the data signal faster when the CPU comes back into the active mode from the sleep mode with reduced latency.

For completeness, the above discussion relates to latency or power consumption improvements for processors, such as CPUs, and the GPIOs that connect these processors to the outside world. Such processors may include and/or represent any type or form of hardware-implemented device capable of interpreting and/or executing computer-readable instructions. In one example, the processor may include and/or represent one or more semiconductor devices implemented and/or deployed as part of a computing system. One example of the processor includes central processing units (CPUs) and microprocessors. Other examples, depending on context, may include microcontrollers, field-programmable gate arrays (FPGAs) that implement softcore processors, application-specific integrated circuits (ASICs), systems on a chip (SoCs), portions of one or more of the same, variations or combinations of one or more of the same, and/or any other suitable processor.

The processor may implement and/or be configured with any of a variety of different architectures and/or microarchitectures. For example, the processor may implement and/or be configured as a reduced instruction set computer (RISC) architecture or the processor may implement and/or be configured as a complex instruction set computer (CISC) architecture. Additional examples of such architectures and/or microarchitectures include, without limitation, 16-bit computer architectures, 32-bit computer architectures, 64-bit computer architectures, x86 computer architectures, advanced RISC machine (ARM) architectures, microprocessor without interlocked pipelined stages (MIPS) architectures, scalable processor architectures (SPARCs), load-store architectures, portions of one or more of the same, combinations or variations of one or more of the same, and/or any other suitable architectures or microarchitectures.

In some examples, the processor may include and/or incorporate one or more additional components that are not explicitly represented and/or illustrated in the figures. Examples of such additional components include, without limitation, registers, memory devices, circuitry, transistors, resistors, capacitors, diodes, connections, traces, buses, semiconductor (e.g., silicon) devices and/or structures, combinations or variations of one or more of the same, and/or any other suitable components that may enable the processor to improve latency or power consumption consistent with method 300 of FIG. 3.

Figure 3:
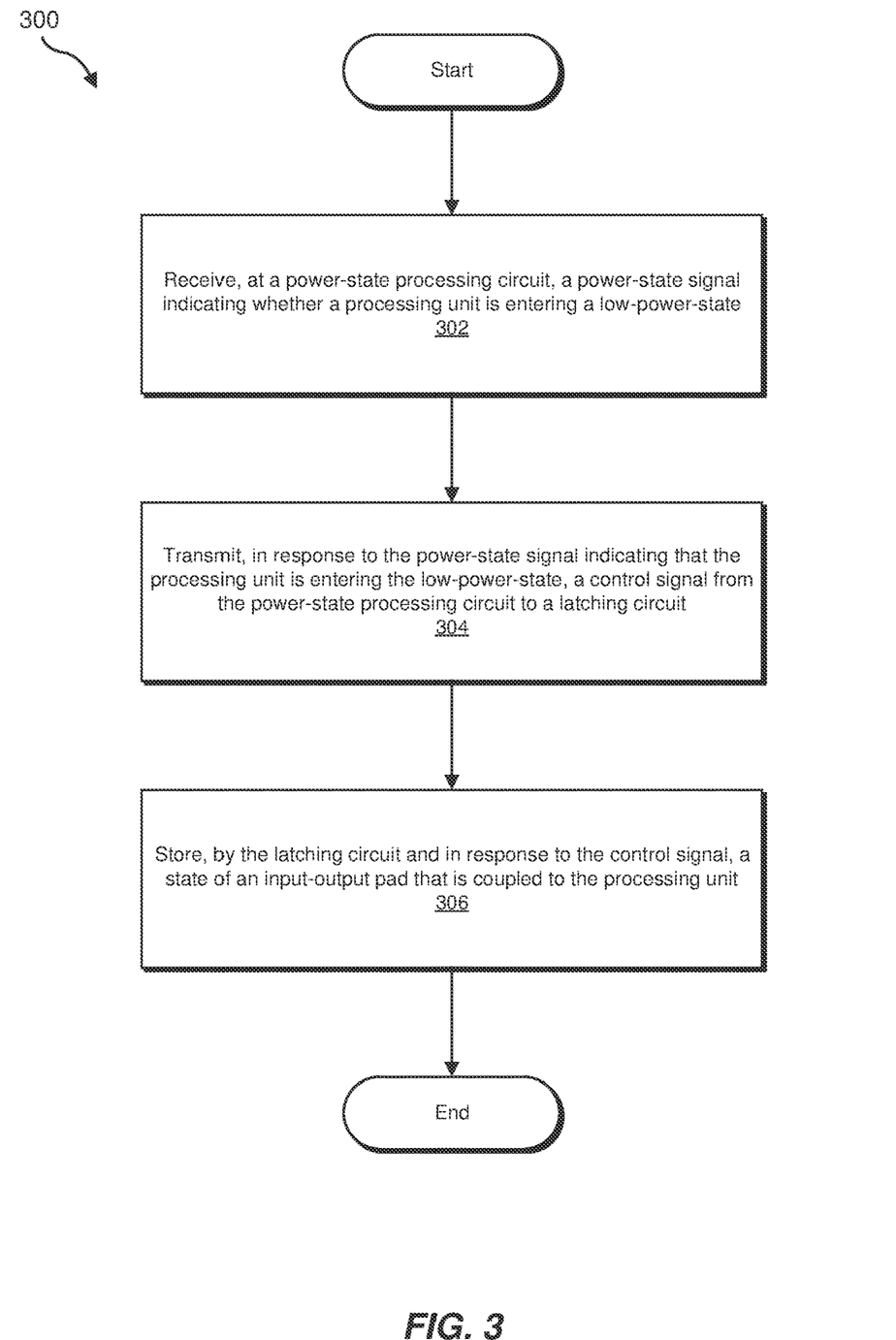
FIG. 3 is a flow diagram of an example method for improving latency or power consumption.

FIG. 3 is a flow diagram of an example method 300 for improving latency or power consumption. In one example, the steps shown in FIG. 3 may be performed by one or more components of a general-purpose input/output incorporated into a computing device, such as the GPIO 407 shown in FIG. 4 (i.e., "GPIO_SR"), and as further discussed above. Additionally or alternatively, the steps shown in FIG. 3 may also incorporate and/or involve various sub-steps and/or variations consistent with the descriptions provided in connection with FIGS. 4-10.

As illustrated in FIG. 3, method 300 may begin at a step 302, where a power-state processing circuit may receive a power-state signal indicating whether a processing unit is entering a low-power-state. As used herein, the term "low-power-state" may generally refer to a state in which a computing device is in a mode, such as a sleep mode, that uses a lower amount of power than in a normal or regular mode of operation. Method 300 may be further understood in the context of a circuit diagram 400 in FIG. 4 and a waveform diagram 500 in FIG. 5. Circuit diagram 400 may correspond to an improved version of circuit diagram 100 in FIG. 1, whereas waveform diagram 500 may correspond to an improved version of waveform diagram 200 in FIG. 2. In particular, at step 302, a power-state processing circuit 408 may receive a power-state signal, "ZSC_IO_EN", from power evaluation circuit 401 (see FIG. 4).

As further discussed above, the lack of state retention and faster save/restore functionality may be addressed with power evaluation circuit 401 (i.e., "POWERGOOD_SR" where "SR" may refer to state retention) and GPIO 407 (i.e., "GPIO_SR"), where a number of components may be introduced such as a sleep-mode indicator 402, a counter-bypass block 405, a power-state processing circuit 408 (i.e., "ZSC_ Logic" in FIG. 4), and a latching circuit 409, which may include a latch 410 and a latch 411. These components may be introduced to retain the state of the GPIO pad and to achieve faster data restoration.

Figure 4:
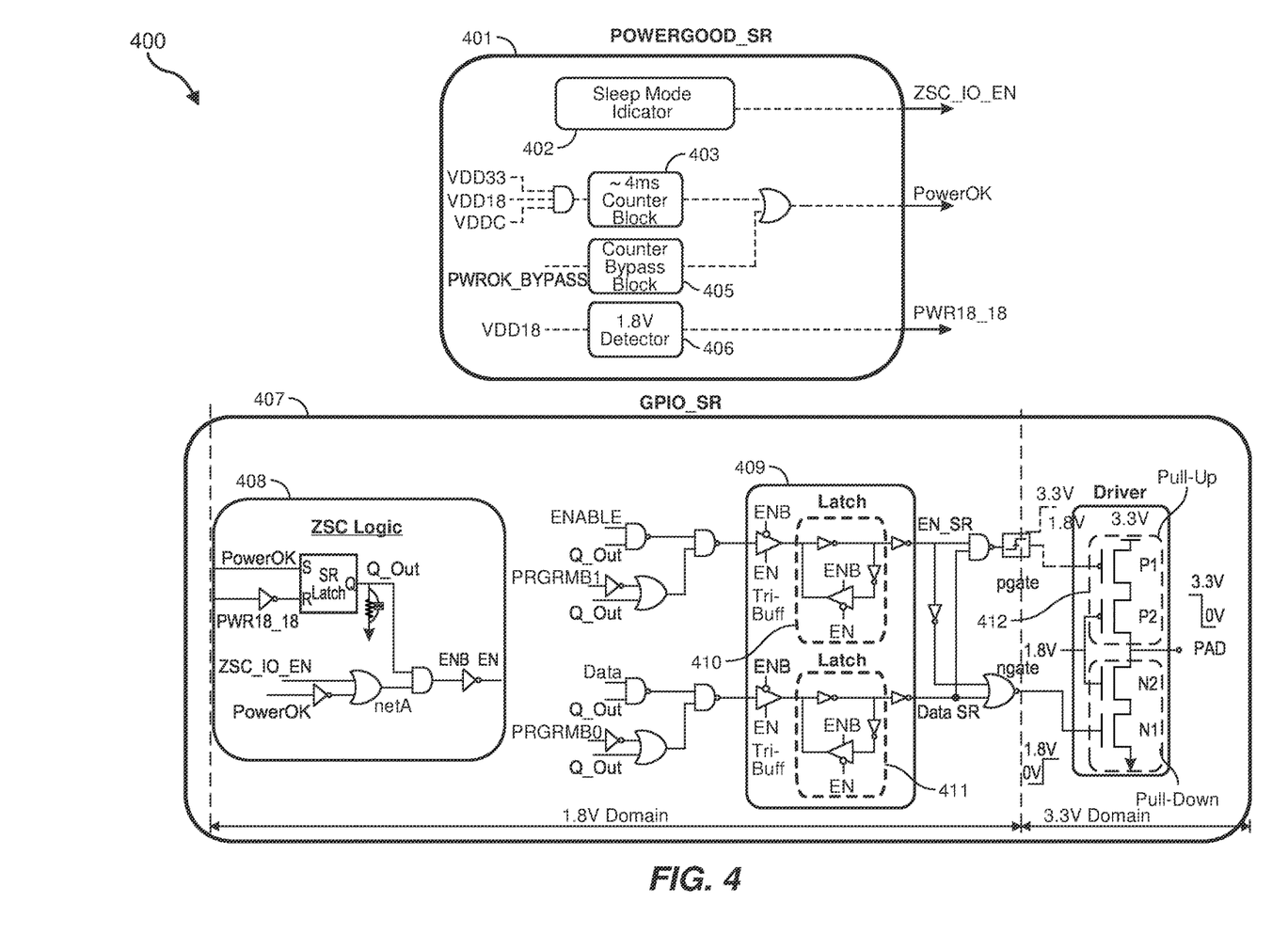
FIG. 4 is a circuit diagram of an improved general-purpose input/output and a corresponding power evaluation circuit with an embedded sleep mode indicator.

In particular, and as further shown in FIG. 4, signals from the set of multiple power sources (e.g., VD33, VDD18, VDDC) are input to an and gate that is coupled to counter block 403. Similarly, a bypass instruction signal (i.e., "PWROK_BYPASS") is input to counter bypass block 402 to enable bypassing of counter block 403. Furthermore, in this example, an output of counter block 403 and an output of counter bypass block 405 are connected as inputs to an or gate, which may generate the PowerOK signal, as discussed further below.

To support the state retention and faster save/restore features of GPIO 407, a few additional signals may be implemented as part of power evaluation circuit 401. The updated design of the power evaluation circuit (in comparison to FIG. 1) may include the following additional blocks, circuits, or components.

Regarding sleep mode indicator 402, once VDD_CORE supply is up, sleep mode indicator 402 senses VDD_CORE supply and asserts ZSC_IO_EN signal high before VDD_CORE goes low. This indicates to GPIO 407 to latch the state of the data signal to its previous value as the CPU is entering the sleep mode. Sleep mode indicator 402 enables the GPIO to start from the point where the previous state of the data signal was latched to the pad of the GPIO. As further shown in FIG. 4, the sleep mode indicator is disposed within the power evaluation circuit that determines whether each of a set of multiple power sources (e.g., VDD33, VDD18, VDD_CORE) is available. Moreover, although the examples of FIGS. 4-10 generally refer to 3.3V, 1.8V, and core power supplies, one having skill in the art may understand that the technology of this application is applicable to a much wider range of differing voltage supplies and values, depending on the particular configuring of each CPU and/or GPIO.

Regarding counter-bypass block 405, this component may receive a signal (e.g., "PWOK_BYPASS" or PowerOK bypass signal) indicating that the delay of counter block 403 should be bypassed. Accordingly, the counter generates the PowerOK signal via either a four millisecond delay path or a path that bypasses the delay to ensure faster data save/restore functionality. Counter-bypass block 405 helps to reduce latency to assist one or more CPUs in transiting from the sleep mode to the active mode as fast as possible.

Regarding 1.8V detector 406, this circuit senses the availability of 1.8V supply and asserts a delayed PWR18_18 signal. This signal has been generated from power evaluation circuit 401, or a corresponding macro, to reset the latch in power-state processing circuit 408.

In addition to the updates to the power evaluation circuit that are outlined above, FIG. 4 also illustrates updates to the GPIO circuit, which has the following additional blocks or components.

Regarding power-state processing circuit 408 (i.e., "ZSC Logic" in FIG. 4), the PWR18_18 signal will be low initially when VDD18 supply is ramping and stable, which resets the SR latch in the ZSC block. The set pin of the latch is low, since PowerOK is low, which ensures Q out=0V, ENB=0V and EN=1.8V (ENB and EN refer to control signals that are discussed further in the context of step 304 of method 300). This enables the programmable bits to define the pad of the GPIO to low, high, or hi-Z. PWR18_18 will be asserted high after a few microseconds delay of VDD18 supply which resets the SR latch to low. As both set and reset of the SR latch are low and hence the Q signal out remains at 0V, again the programmable bits define the value of the GPIO pad. Once PowerOK is asserted, the ZSC logic now helps to hold the Q signal output of the S-R latch to high even when the PowerOK signal goes low along with the VDD_CORE supply. Since the Q signal out is latched to high, it disables the programmable bits PRGRMB1 and PRGRMB0 path to avoid the GPIO pad getting programmed to high, low, or hi-Z. Rather, GPIO 407 functions as a regular GPIO (see FIG. 1) without any state retention until ZSC_IO_EN is asserted from sleep mode indicator 402. Sleep mode indicator 402 asserts ZSC_IO_EN to high before the core supply goes down, and this indicates that the value of the GPIO pad in GPIO 407 should be latched. Once ZSC_IO_EN asserts to high before the core supply goes down, the ZSC logic makes ENB=1.8V and EN=0V, and this helps the GPIO pad to latch to the previous value of the data signal even though the PowerOK signal goes Low.

To summarize regarding the power-state processing circuit, the power-state processing circuit may include a second latching circuit (i.e., the "SR Latch" in power-state processing circuit 408 in FIG. 4 may correspond to the second latching circuit, whereas latching circuit 409 may correspond to the first or original latching circuit of step 304 of method 300). As further shown in FIG. 4, the second latching circuit accepts a first signal to set (see the "S" input of the SR latch in power-state processing circuit 408), and this first signal (e.g., PowerOK) may indicate whether each of the set of multiple power sources is available, consistent with the configuration of power evaluation circuit 401. The second latching circuit (i.e., the SR latch of power-state processing circuit 408) may also accept a second signal (e.g., PWR18_18) to reset the second latching circuit, and the second signal may indicate whether a specific voltage power source (e.g., VDD18) is available.

Moreover, in the example of FIG. 4, the second latching circuit may generate an output (e.g., "Q_Out" in FIG. 4) that is connected as an input to an and gate that generates the control signal (e.g., "ENB") for operating latching circuit 409. Similarly, power-state processing circuit 408 may invert the control signal ("ENB") to create a second control signal ("EN") for further operating latching circuit 409. In these examples, assertion of the output of the second latching circuit may disable at least one programmable pin (e.g., PRGRMB1 and PRGRMB0) that is coupled to the input/output pad.

Regarding latching circuit 409, this circuit may be introduced in the data path to pass or latch the data based on an output from the power-state processing circuit (e.g., "ZSC logic" in FIG. 4). In normal functioning mode, the latch allows the pad of the GPIO to track either the data signal, or the programmable bits, due to the fact that ZSC_IO_EN is low. In contrast, in the state-retention mode, when ZSC_IO_EN goes high, then latching circuit 409 holds the previous value of the data input and helps the pad to retain its previous state to facilitate state retention.

In particular, and as further shown in FIG. 4, latching circuit 409 may further include a first latch 410 for storing an enabling signal ("ENABLE" in FIG. 4) and may include a second latch for storing a data signal ("Data" in FIG. 4) that corresponds to the enabling signal. The enabling signal may facilitate or enable the timing or communication of data across the data signal, for example.

Lastly, for completeness, diagram 400 effectively divides GPIO 407 into a first domain (i.e., 1.8V domain) and a second domain (i.e., 3.3V domain). In these examples, the GPIO may include a driver (on the right side of GPIO 407 in FIG. 4) converts an output from the first voltage domain to the second voltage domain. Moreover, as used herein, the term "general-purpose input/output" may generally refer to an uncommitted digital signal pin on an integrated circuit or electronic circuit board which may be used as an input or output, or both, and is controllable by software. GPIOs may have no predefined purpose and are unused by default. If used, the purpose and behavior of a GPIO may be defined and implemented by the designer of higher assembly-level circuitry: the circuit board designer in the case of integrated circuit GPIOs, or system integrator in the case of board-level GPIOs.

Returning to FIG. 3, at step 304, a power-state processing circuit may transmit, in response to the power-state signal indicating that the processing unit is entering the low-power-state, a control signal from the power-state processing circuit to a latching circuit. For example, in the context of FIG. 4, power-state processing circuit 408 may transmit a control signal ENB to latching circuit 409, where the signal ENB controls whether latching circuit 409 operates in a pass-through mode or in a state retention latching mode, as discussed further below. Similarly, at step 306, the latching circuit may store, in response to the control signal, a state of an input/output pad that is coupled to the processing unit. For example, in the context of FIG. 4, latching circuit 409 may, in response to control signal ENB and/or its negation EN, store a state of GPIO 407's pad (i.e., "PAD" in FIG. 4), which may be coupled to the CPU to provide an interface between the CPU and the external world. Storing the state of the input/output pad enables the state to be retrieved from the latching circuit upon the processing unit switching from the sleep mode to an active mode, as discussed further below.

Figure 5:
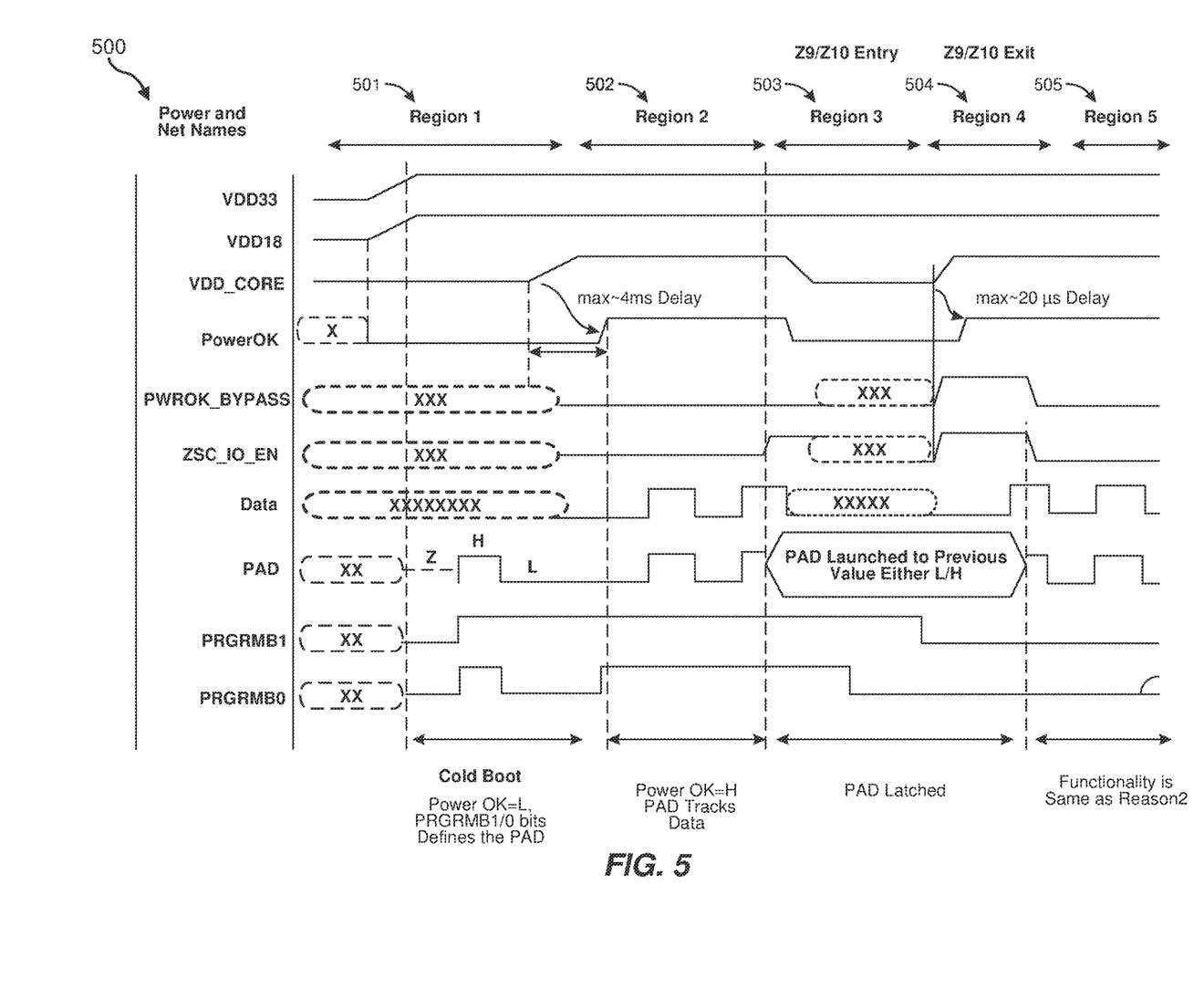
FIG. 5 is a waveform diagram corresponding to operation of the improved general-purpose input/output and demonstrating lower latency.

To further help explain the performance of steps 304-206 by GPIO 407, FIG. 5 shows an illustrative example of a waveform diagram 500, which may correspond to operation of GPIO 407, and which may be contrasted with waveform diagram 200. Waveform diagram 500 may include a first region 501, a second region 502, a third region 503, a fourth region 504, and a fifth region 505, which may correspond to the regions of waveform diagram 200, as discussed above (where region 503 and region 504 together map to entry and exit of the sleep mode corresponding to region 203 in FIG. 2).

First, the CPU is initially booted up with the input/output power supplies and the core supply is expected to ramp-up sooner or later as part of power sequencing. As discussed above for FIG. 2, the region where the input/output supplies are present and the core supply is absent during first boot-up is referred as "cold boot."

In the first region, VDD33 and VDD18 supplies are stable, but core supply is low and hence the PowerOK signal is 0V. As PowerOK is 0V, this makes the Q signal out=0V, ENB=0V and EN=1.8V, now data and ENABLE inputs lose control of GPIO 407, and the pad will be defined by PRGRMB1 and PRGRMB0 bits.

If PRGRMB1=0V and PRGRMB0=0V, this makes EN_SR=0V, pgate=3.3V, Data_SR=0V and ngate=0V, hence both the pull-up and pull-down drivers are OFF, and the GPIO pad will be defined to hi-Z. If PRGRMB1=1.8V and PRGRMB0=1.8V, this makes EN_SR=1.8V, pgate=1.8V, Data_SR=1.8V and ngate=0V, hence the pull-up driver is ON and the pull-down driver is OFF, and the GPIO pad will be defined to 3.3V which is high.

If PRGRMB1=1.8V and PRGRMB0=0V, this makes EN_SR=1.8V, pgate=3.3V, Data_SR=0V and ngate=1.8V, hence the pull-up driver is OFF and the pull-down driver is ON, and then the GPIO pad will be defined to 0V, which is low. In another scenario, PRGRMB1=0V and PRGRMB0=1.8V, but this case should not be used.

In the second region, the CPU enters normal mode or active mode. Once VDD_CORE is up, PowerOK is asserted after about four milliseconds of delay from the power evaluation circuit (e.g., the POWERGOOD_SR macro in FIG. 4), but still ZSC_IO_EN=0V, ENB=0V and EN=1.8V and then the GPIO pad follows the ENABLE and data signal inputs. If ENABLE=0V, EN_SR=0V, pgate=3.3V and ngate=0V, hence the GPIO pad will be defined to hi-Z. In contrast, if ENABLE=0.75V, Data=0V, then pgate=3.3V and ngate=1.8V, hence the pull-up driver is OFF and the pull-down driver is ON and the GPIO pad is pulled to low. Lastly, if data=0.75V, then pgate=1.8V and ngate=0V, hence the pull-up driver is ON and the pull-down driver is OFF, and the GPIO pad is pulled to high.

In the third region, the CPU enters a sleep mode, which may be referred to as as Z9/Z10 entry state in certain embodiments. The ZSC_IO_EN signal is asserted by sleep mode indicator 402 before VDD_CORE is pulled low to save power. Once the ZSC_IO_EN signal is asserted the ZSC logic in GPIO 407 generates ENB=1.8V and its negation EN=0V as control signals, which control latching circuit 409 such that the previous state of the GPIO pad is latched. If Data=0.75V, then the pad will be latched to 3.3V, whereas if data=0V, then the pad will be latched to 0V. The pad will be latched to the previous state of the data signal to the state retention feature with the help of sequential logic implemented in the GPIO 407. The methodology of FIGS. 3-5 enables deeper Z-state or sleep mode functionality in the CPU such that the state of the data signal is stored within latching circuit 409 even in the absence of Core supply. Once the CPU enters the normal mode or active mode, which may be referred to as the Z9/Z10 exit state in certain embodiments, then VDD_CORE is asserted back.

In the fourth region, the counter bypass signal (i.e., "PWROK_BYPASS" in FIG. 4) is generated from the power evaluation circuit (i.e., "POWERGOOD_SR" macro in FIG. 4), which indicates that the PowerOK signal will be asserted high as fast as possible in terms of microseconds. The pad of the GPIO will be latched to the previous value till ZSC_IO_EN is high and the pad starts following the data signal once ZSC_IO_EN is de-asserted. This methodology achieves faster restore of the state of the data signal during the transition from the sleep mode to the active mode, and the CPU will be able to start from where it had stopped, thereby reducing latency.

Figure 6:
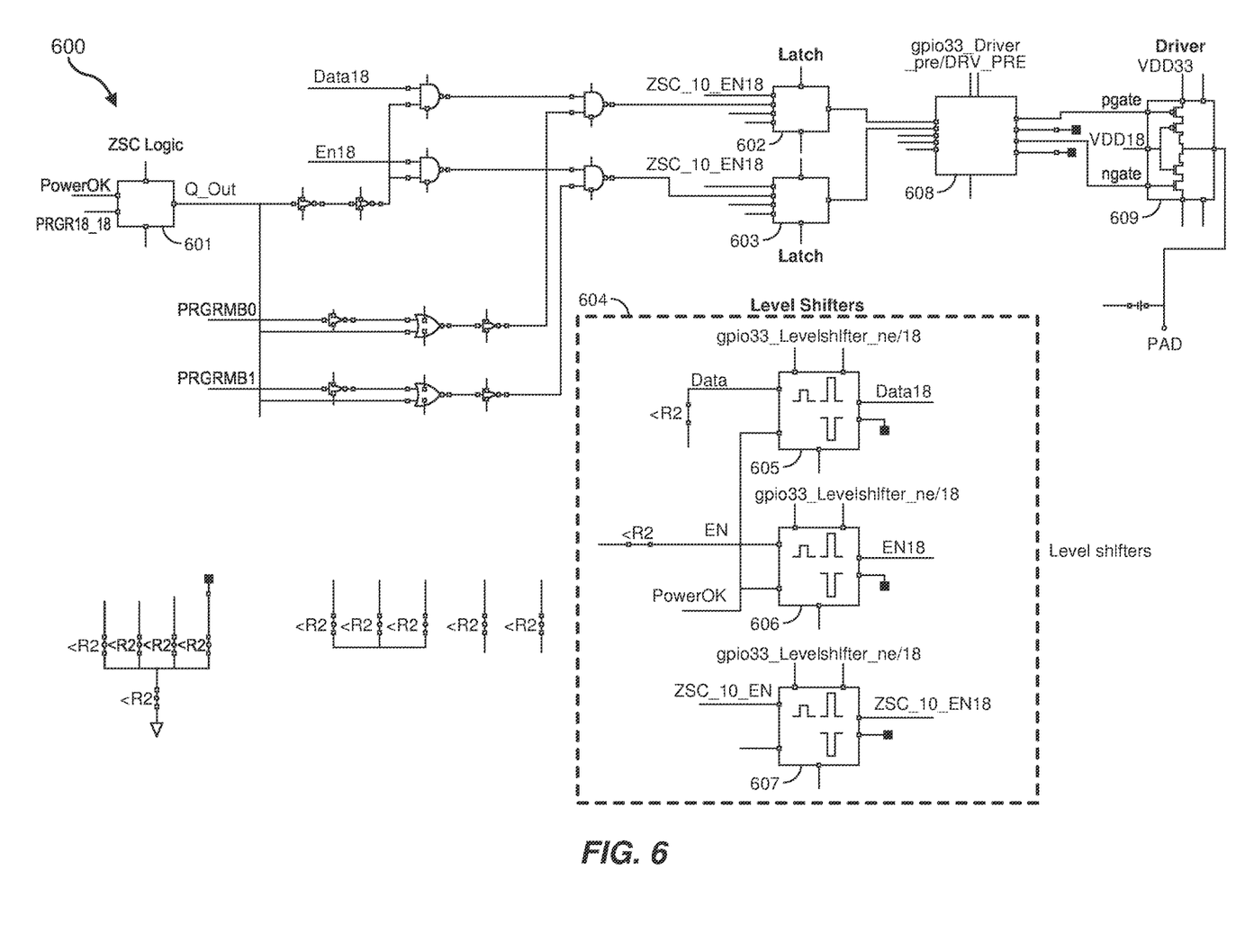
FIG. 6 is a diagram of a circuit setup to implement state retention within the improved general-purpose input/output.

FIG. 6 shows an illustrative example diagram of a circuit implementation and verification for the power evaluation circuit and improved GPIO of FIG. 4. As further shown in this figure, ZSC Logic corresponding to the power-state processing circuit may receive the PowerOK and PRGR18_18 signals and generate a Q_Out signal, which may form the basis for the ENB and EN control signals to control a latch 602 and a latch 604 within the corresponding latching circuit. The latching circuit may generate output to a pre-driver processing circuit 608, which in turn may provide output to a driver 609 that generates the signal for the pad ("PAD" in FIG. 6" of the GPIO. FIG. 6 also illustrates how a set 604 of level shifters 605-607 may be used to appropriately shift levels for the data, ENABLE, and ZSC_10_EN signals.

In the context of FIG. 6, the circuit schematic setup should achieve the following features. In the first region of the cold boot where VDD33 and VDD18 are stable and core supply is low, then the GPIO pad would be defined by the programmable bits. When all the supplies are stable, the circuit is expected to transmit the data from the input to the pad of the GPIO, thereby enabling input/output communications between the CPU and the external world. The core data inputs at 0.75V voltage is level-shifted to (0V→1.8V) and then again level-shifted to (1.8V-3.3V) to avoid disadvantages of 1.8V I/O devices and to support 3.3V signaling. During the transition from the active mode to the sleep mode, the current state of the signal at the pad should be stored. During the transition from the sleep mode to the active mode, the state of the data signal should be restored from where it had stopped with less latency (in comparison to FIGS. 1-2 for example).

Figure 7:
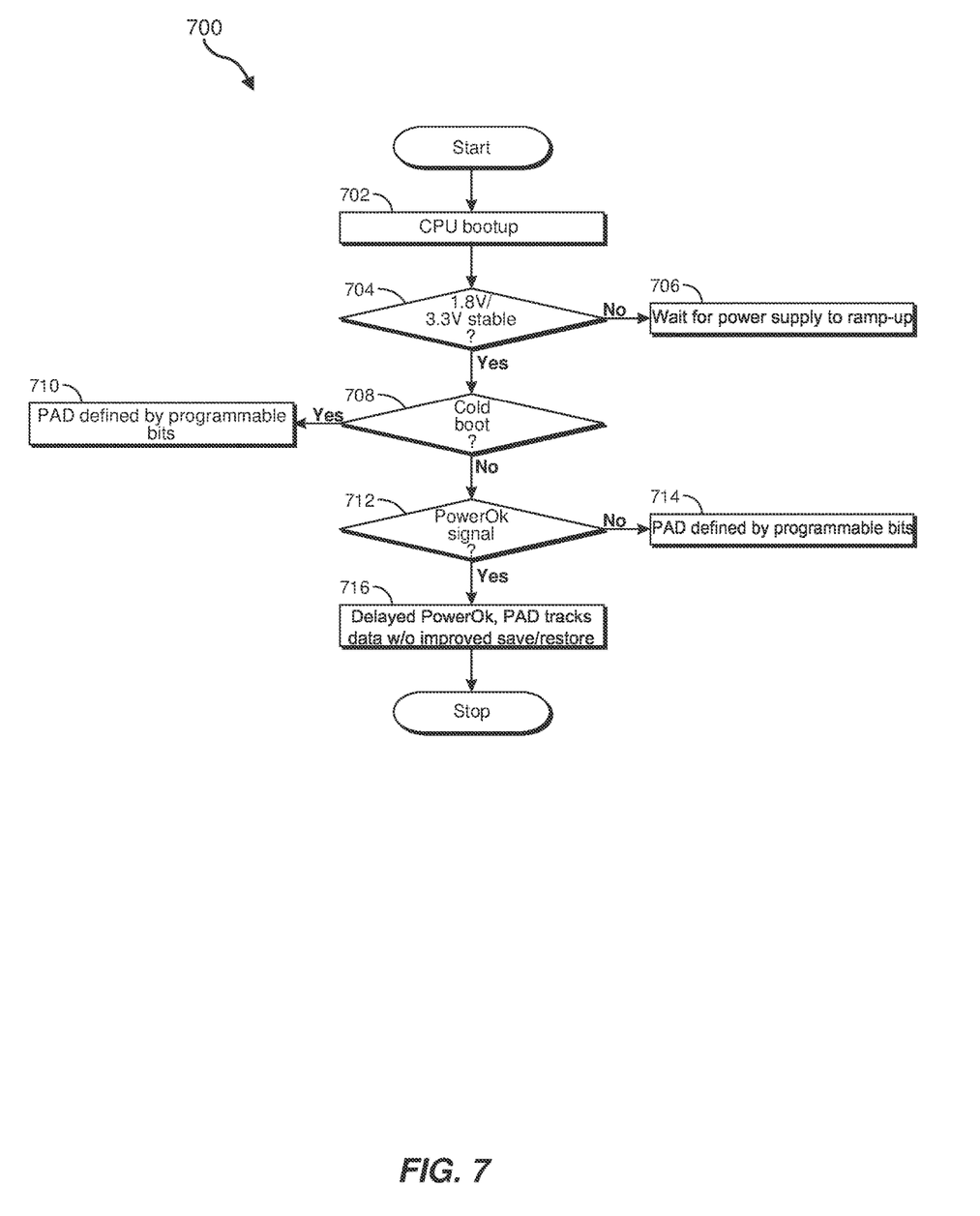
FIG. 7 is a flow diagram for a method of operating the suboptimized general-purpose input/output upon CPU boot-up.
Figure 8:
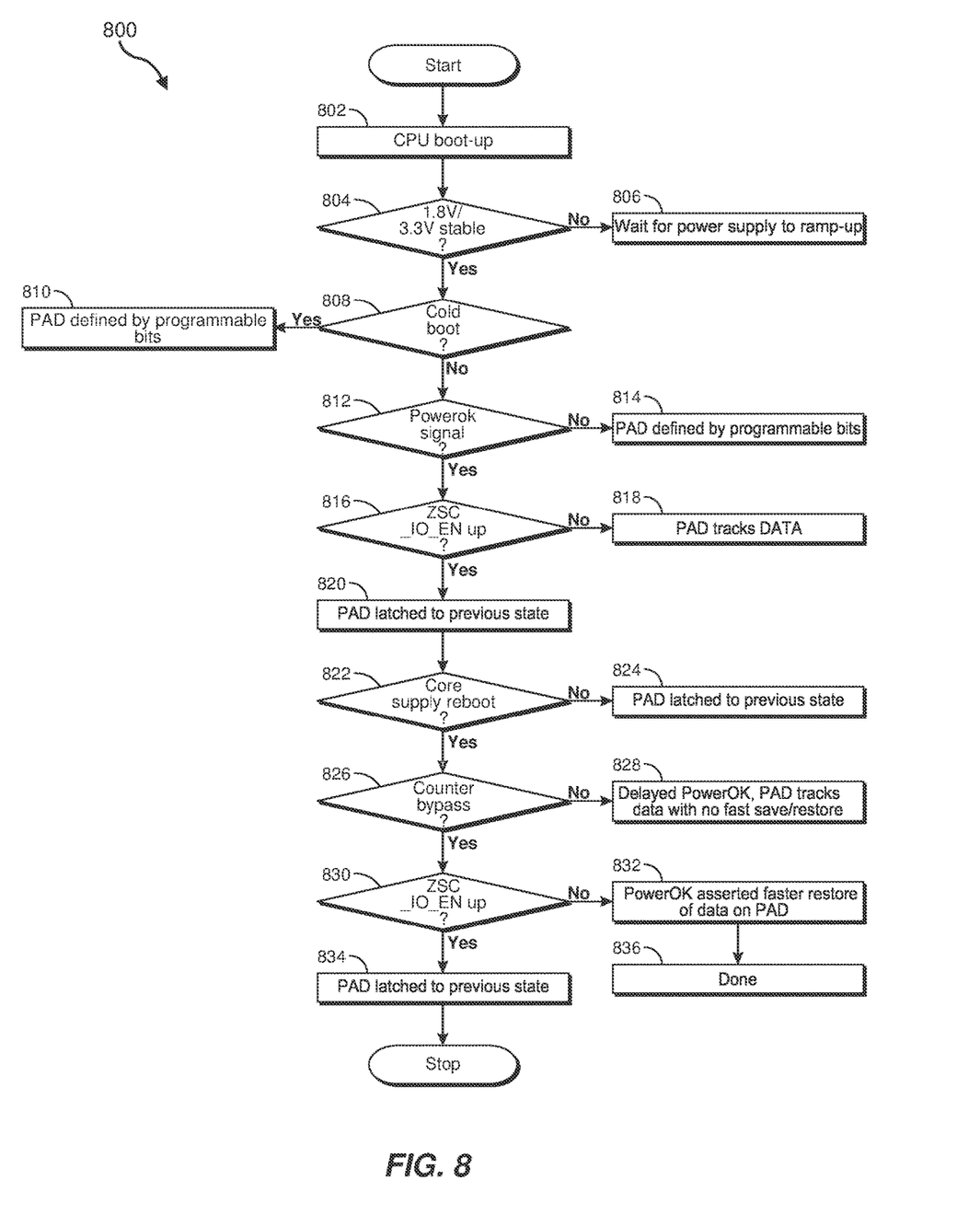
FIG. 8 is a flow diagram for a method of operating the improved general-purpose input/output upon CPU boot-up.

FIGS. 7-8 provide contrasting flow diagrams to compare the methodology of the GPIO setup of FIGS. 1-2 and the improved GPIO setup of FIGS. 3-6. Flow diagram 700 of FIG. 7 may generally be consistent with waveform diagram 200 of FIG. 2. At step 702, the CPU may bootup as part the first region 201. At decision step 704, a check is performed of whether the input/output supplies (e.g., 1.8V and 3.3V) are stable, as indicated by power evaluation circuit 102. If the decision is no at step 704, then the system may wait for these power supplies to ramp up at step 706. Alternatively, if the decision is yes at step 704, then the flow diagram may proceed to a decision step 708, at which point a check is performed to determine whether the computing system is in a cold boot scenario. If the answer is yes at decision 708, then the flow diagram may proceed to step 710, at which point the value of the pad of the GPIO be defined by the programmable bits, which are further discussed above. Alternatively, if the answer is no at decision 708, then the flow diagram may proceed to a decision step 712, at which point a check is performed to determine whether the PowerOK signal is asserted. If the answer is no at decision step 712, then the flow diagram may proceed to a step 714, at which point the pad of the GPIO may be defined by the programmable bits, similar to step 710. Alternatively, if the answer is yes at step 712, then the flow diagram may proceed to a step 716, at which point the PowerOK signal may be asserted with delay and the pad of the GPIO returns to tracking the data signal, but without the benefits of the improved save/restore functionality that is further discussed above in connection with FIGS. 3-6.

In comparison, FIG. 8 shows a flow diagram 800, which may correspond to the improved GPIO and methodology of FIGS. 3-6. Flow diagram 800 may include steps 802-812, which may generally parallel steps 702-712 of method 700. Whereas steps 702-712 led to a step 716 where PowerOK was asserted with delay and the pad of the GPIO tracks the data signal without the benefits of improved save/restore functionality, flow diagram 800 may proceed with a corresponding step 816 where, instead, a check is performed of whether ZSC_IO_EN is up or asserted. If the answer is no at step 816, then flow diagram 800 may proceed to a step 818, at which point the pad of the GPIO may track the corresponding input data signal. In contrast, if the answer is yes at step 816, in the flow diagram may proceed to a step 820, at which point the previous state of the data signal at the pad of the GPIO may be latched using the latching circuit.

Moreover, from step 820 the flow diagram may further proceed to a decision step 822, at which point a check may be performed to determine whether the core supply is being rebooted. If the answer is no at step 822, then the flow diagram may proceed to a step 824, at which point the previous state of the pad of the GPIO may be latched to the performance of step 820. If the answer is yes at step 822, and the flow diagram may proceed to a decision step 826, at which point a check is performed to determine whether the counter should be bypassed (e.g., based on PWROK_BYPASS of FIG. 4). If the answer is no at step 86, then the flow diagram may proceed to step 828, at which point the PowerOK signal may be asserted with delay and the pad of the GPIO may track the data signal without the benefits of faster save/restore functionality, similar to steps 716 of method 700. On the other hand, if the answer is yes at step 826, indicating the usage of counter bypass block 405 from FIG. 4, then flow diagram may proceed to a decision step 830, at which point a check is performed to determine whether the sleep mode indicator signal (i.e., "ZSC_IO_EN") is asserted to warn or alert about the CPU entering the sleep mode.

If the answer is no at step 830, then the flow diagram may proceed to step 832, at which point the PowerOK signal may be asserted with the faster restoring of the state of the data signal on the pad of the GPIO. From step 832, the flow diagram may further proceed to step 836, at which point the flow diagram may end. On the other hand, if the answer is yes at step 830, then the flow diagram may proceed to step 834, at which point the previous state of the pad of the GPIO may be latched consistent with FIGS. 3-6.

Figure 9:
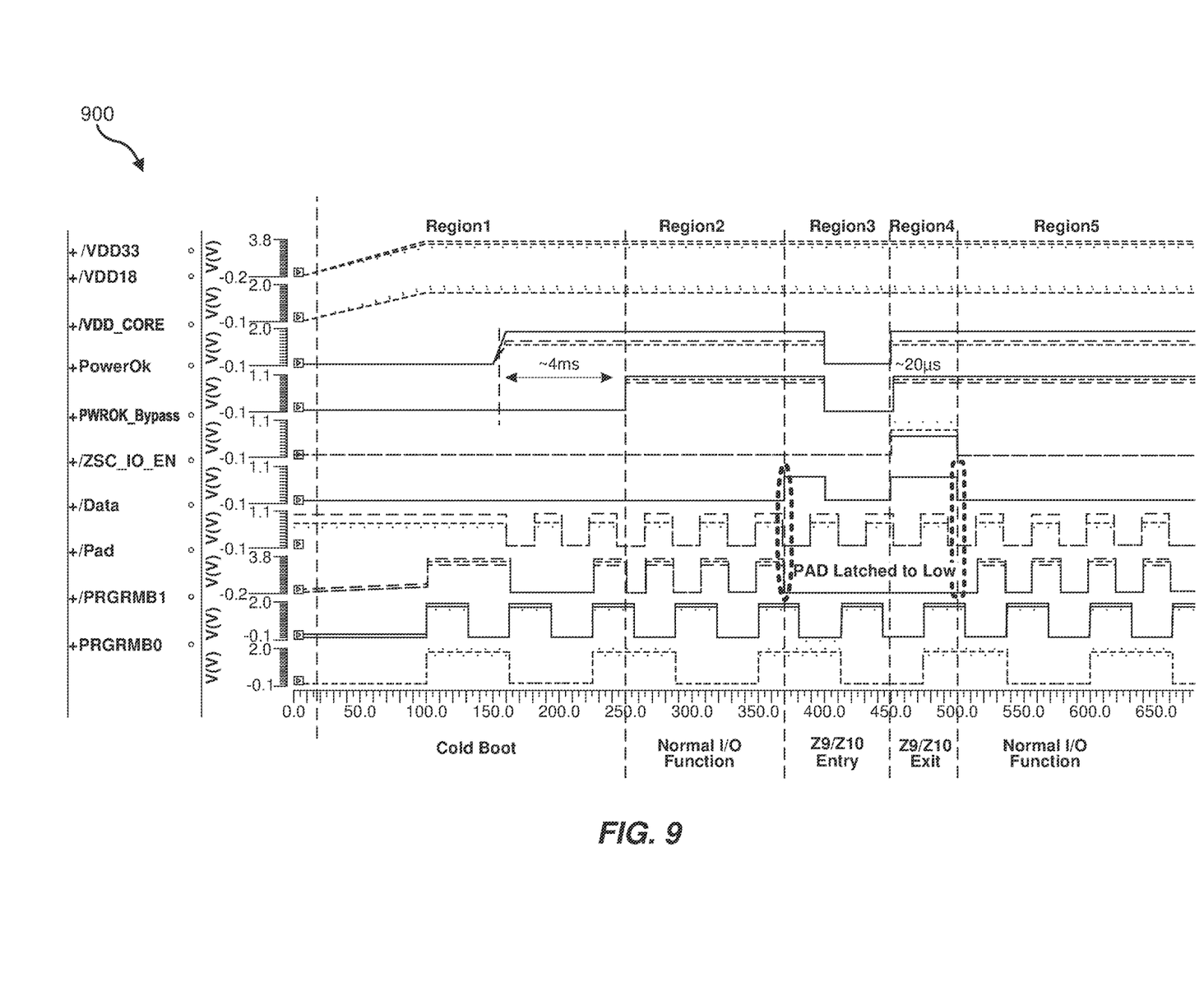
FIG. 9 is a waveform diagram corresponding to operation of the improved general-purpose input/output across a process, voltage, and temperature simulation when the general-purpose input/output pad is latched to low.
Figure 10:
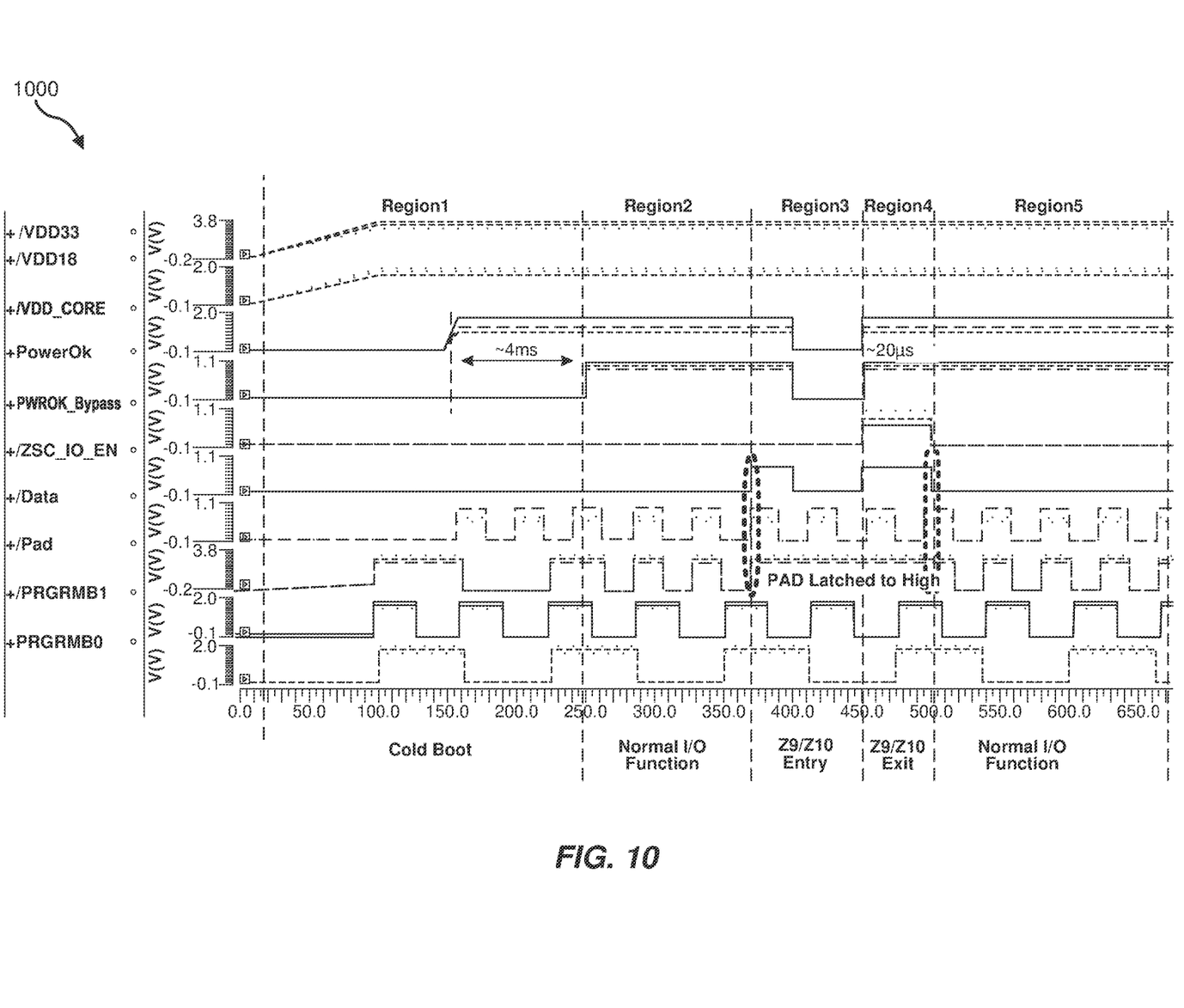
FIG. 10 is a waveform diagram corresponding to operation of the improved general-purpose input/output across a process, voltage, and temperature simulation when the general-purpose input/output pad is latched to high.

FIGS. 9-10 provide additional illustrative examples of waveform diagrams, which are similar to waveform diagram 500 of FIG. 5, and which may correspond to simulation waveforms for verifying that the architecture or methodology of FIGS. 4-6 may perform suitably across a number of process, voltage, and temperature ("PVT") combinations. In particular, FIG. 9 and FIG. 10 both correspond to a range of processes (e.g., slow, fast, slow_fast, fast_slow), voltages (VDD33 (2.97V-3.3V-3.63V), VDD18 (1.62 v-1.8 v-1.98 v) and VDD_CORE (0.6 v-0.75 v-1.05 v), and temperatures (0° C.-27° C.-100° C.) for verification of the GPIO architecture.

FIG. 9 illustrates a waveform diagram 900 in which the pad of the GPIO is latched to low across the PVT simulation. As shown in this figure, in the first region, which corresponds to the cold boot scenario, then pad of the GPIO will be defined according to the programmable bits. Once the PowerOK signal is asserted in the second region, then the pad of the GPIO tracks the data signal. When the sleep mode indicator signal (i.e., ZSC_IO_EN pin) is asserted before VDD_CORE goes low in the third region, the data (which is in a low state in FIG. 9) is latched to the pad across all PVT conditions. Once VDD_CORE is re-asserted, the counter bypass signal (i.e., PWROK_BYPASS) and ZSC_IO_EN will be enabled and the pad of the GPIO will be still latched to low. When ZSC_IO_EN goes Low, the pad of the GPIO again begins to track the data signal, as in the normal functioning mode of the second region, within 20 microseconds with the help of the PWROK_BYPASS pin. FIG. 10 shows a parallel waveform diagram 1000, except that FIG. 10 corresponds to a scenario whether the pad is latched to high rather than being latched to low.

In summary, the following provides a generalized overview of the problem solved and the benefits achieved by the technology of this application. Certain suboptimal GPIO architectures may not support all three pad definition states (low, high, or hi-Z) during a cold boot scenario (i.e., when VDD_CORE=0). This means that three dedicated macros may be used to define each pad definition state depending on the system on a chip ("SoC") usage. A first macro (e.g., "GPIO_Z") may program the pad to be in a logical hi-Z during cold boot, a second macro (e.g., "GPIO_H") may program the pad to be in a logical high state during cold boot, and a third macro (e.g., "GPIO_L") may program the pad to be in a logical low state during cold boot. These embodiments of the GPIO may not be capable of retaining the state of the pad during a sleep mode (e.g., during Z9/Z10 entry and exit state). These embodiments may also not support fast restore functionality during the sleep mode exit transition. It can take about three to four milliseconds to operate in normal GPIO mode after the sleep mode exit transition, which is the same amount of time taken for normal GPIO operation after a cold boot from a powered off state. These embodiments do not support both pad definition (e.g., for cold boot) or state retention (e.g., for a low power state) together due to the fact that VDD_CORE=0 zero in both scenarios.

In contrast, the GPIO and methodology of FIGS. 4-6 may encapsulate the following features. First, GPIO pad definition may be established with the help of programmable bits during cold boot. Second, and in contrast, state retention of the state of the pad may be enabled during a sleep mode entry and exit. Third, faster restore functionality may be achieved when exiting a sleep mode in comparison to the cold boot scenario.

During a cold boot (i.e., VDD_CORE=0), the SoC can configure a GPIO pad to any one of the states (low or high or hi-Z) using programmable bits based on their usage. Otherwise, the SoC may not have flexibility to change the pad definition state with a single macro. The proposed solution provides three pad definition states in a single macro with the help of programmable bits.

The following provides an overview of the state retention feature for the GPIO pad during the sleep mode entry and exist. The improved architecture is designed in such a way that during cold boot (VDD_CORE=0) programmable bits defines the PAD to be low or high or hi-Z. The pad tracks or follows the data signal during a normal mode of operation and when the CPU enters the sleep mode (e.g., Z9/Z10 state where VDDC=0) then the pad may retain the previous state of the data signal at the pad.

One inventive insight here is that VDD_CORE=0 for both the cold boot scenario and the sleep mode state such that, during cold boot, the programmable bits define the state and during the sleep mode entry, the pad retains the previous state of the data signal. During the sleep mode, the architecture disables the programmable bits as controls and the architecture enables the state retention logic that corresponds to the power-state processing circuit and the latching circuit. This shows that the architecture can detect the difference between a cold boot scenario (the first region of FIGS. 2 and 5) and the sleep mode (the third region of FIGS. 2 and 5) which is the key highlight of this architecture.

After the cold boot, when VDD_CORE is ramped from low to high, the GPIO takes three to four milliseconds to operate in normal GPIO mode (e.g., a buffer mode corresponding to the second region of FIG. 2). In contrast, the sleep mode entry transition, VDD_CORE goes to low and the GPIO pad retains the state of the data signal, whereas during the sleep mode exit state, VDD_CORE is ramped from low to high again, the GPIO resumes normal operations within about 20 microseconds from where it was stopped. This 20 microseconds is much faster than the three to four milliseconds associated with the suboptimal GPIO of FIGS. 1-2. This indicates that the proposed architecture ensures faster data restore functionality when the CPU comes back to the active mode from the sleep mode with reduced latency.

While the foregoing disclosure sets forth various embodiments using specific block diagrams, flowcharts, and examples, each block diagram component, flowchart step, operation, and/or component described and/or illustrated herein may be implemented, individually and/or collectively, using a wide range of hardware, software, or firmware (or any combination thereof) configurations. In addition, any disclosure of components contained within other components should be considered exemplary in nature since many other architectures can be implemented to achieve the same functionality.

The apparatuses, systems, and methods described herein may employ any number of software, firmware, and/or hardware configurations. For example, one or more of the exemplary embodiments and/or implementations disclosed herein may be encoded as a computer program (also referred to as computer software, software applications, computer-readable instructions, and/or computer control logic) on a computer-readable medium. The term "computer-readable medium" generally refers to any form of device, carrier, or medium capable of storing or carrying computer-readable instructions. Examples of computer-readable media include, without limitation, transmission-type media, such as carrier waves, and non-transitory-type media, such as magnetic-storage media (e.g., hard disk drives and floppy disks), optical-storage media (e.g., Compact Disks (CDs) and Digital Video Disks (DVDs)), electronic-storage media (e.g., solid-state drives and flash media), and/or other distribution systems.

In addition, one or more of the modules, instructions, and/or micro-operations described herein may transform data, physical devices, and/or representations of physical devices from one form to another. Additionally or alternatively, one or more of the modules, instructions, and/or micro-operations described herein may transform a processor, volatile memory, non-volatile memory, and/or any other portion of a physical computing device from one form to another by executing on the computing device, storing data on the computing device, and/or otherwise interacting with the computing device.

The process parameters and sequence of the steps described and/or illustrated herein are given by way of example only and can be varied as desired. For example, while the steps illustrated and/or described herein may be shown or discussed in a particular order, these steps do not necessarily need to be performed in the order illustrated or discussed. The various exemplary methods described and/or illustrated herein may also omit one or more of the steps described or illustrated herein or include additional steps in addition to those disclosed.

The preceding description has been provided to enable others skilled in the art to best utilize various aspects of the exemplary embodiments disclosed herein. This exemplary description is not intended to be exhaustive or to be limited to any precise form disclosed. Many modifications and variations are possible without departing from the spirit and scope of the instant disclosure. The embodiments disclosed herein should be considered in all respects illustrative and not restrictive. Reference should be made to the appended claims and their equivalents in determining the scope of the instant disclosure.

Unless otherwise noted, the terms "connected to" and "coupled to" (and their derivatives), as used in the specification and claims, are to be construed as permitting both direct and indirect (i.e., via other elements or components) connection. In addition, the terms "a" or "an," as used in the specification and claims, are to be construed as meaning "at least one of." Finally, for ease of use, the terms "including" and "having" (and their derivatives), as used in the specification and claims, are interchangeable with and have the same meaning as the word "comprising."

What is claimed is:

1. A method comprising:
   receiving, at a power-state processing circuit, a delayed power availability signal and a power-state signal indicating whether a processing unit is entering a low-power-state;
   transmitting, in response to the power-state signal indicating that the processing unit is entering the low-power-state, a control signal from the power-state processing circuit to a latching circuit;
   storing, by the latching circuit and in response to the control signal, a state of a data signal at an input/output pad that is coupled to the processing unit;
   bypassing, in response to exiting the low-power-state, a delay of the delayed power availability signal by asserting a non-delayed power availability signal; and
   restoring, by the latching circuit and in response to the non-delayed power availability signal, the state of the data signal at the input/output pad.

2. The method of claim 1, wherein:
   the low-power-state comprises a sleep mode of the processing unit;
   receiving the power-state signal comprises receiving the power-state signal from a sleep mode indicator;
   the sleep mode indicator is disposed within a power evaluation circuit that determines whether each of a set of multiple power sources is available; and
   storing the state of the input/output pad enables the state to be retrieved from the latching circuit upon the processing unit switching from the sleep mode to an active mode.

3. The method of claim 2, wherein:
   the power evaluation circuit comprises a counter block and a counter bypass block;
   signals from the set of multiple power sources are input to an and gate that is coupled to the counter block; and
   a bypass instruction signal is input to the counter bypass block to enable bypassing the counter block.

4. The method of claim 3, wherein an output of the counter block and an output of the counter bypass block are connected as inputs to an or gate.

5. The method of claim 1, wherein:
   the power-state processing circuit comprises a second latching circuit;
   the second latching circuit accepts the power availability signal to set the second latching circuit, the power availability signal indicating whether each of a set of multiple power sources is available; and
   the second latching circuit accepts a second signal to reset the second latching circuit, the second signal indicating whether a specific voltage power source is available.

6. The method of claim 5, wherein:
   the second latching circuit generates an output that is connected as an input to an and gate that generates the control signal for operating the latching circuit; and
   the power-state processing circuit inverts the control signal to create a second control signal for further operating the latching circuit.

7. The method of claim 6, wherein assertion of the output of the second latching circuit disables at least one programmable pin that is coupled to the input/output pad.

8. The method of claim 1, wherein:
   the latching circuit comprises a first latch for storing an enabling signal; and
   the latching circuit comprises a second latch for storing a data signal that corresponds to the enabling signal.

9. The method of claim 1, wherein:
   the power-state processing circuit and the latching circuit are disposed on a general-purpose input/output;
   the general-purpose input/output comprises a first voltage domain and a second voltage domain; and
   the general-purpose input/output comprises a driver that converts an output from the first voltage domain to the second voltage domain.

10. The method of claim 1, wherein performing the method enables the input/output pad to return to tracking a data signal within about 20 microseconds of the processing unit switching from a sleep mode to an active mode.

11. A device comprising:
a power evaluation circuit configured to:
send a delayed power availability signal during an active state of a processing unit;
send a power state signal indicating whether the processing unit is entering a low-power-state; and
bypass a delay of the delayed power availability signal by asserting a non-delayed power availability signal in response to the processing unit exiting the low-power-state;
a power-state processing circuit that is configured to receive the delayed power availability signal and the power-state signal; and
a latching circuit that is configured to:
couple the processing unit to an input/output pad;
respond to the power-state signal indicating that the processing unit is entering the low-power-state by storing a state of a data signal at the input/output pad; and
respond to the non-delayed power availability signal by restoring the state of the data signal at the input/output pad.

12. The device of claim 11, wherein:
the low-power-state comprises a sleep mode of the processing unit;
the power-state processing circuit receives the power-state signal at least in part by receiving the power-state signal from a sleep mode indicator;
the sleep mode indicator is disposed within the power evaluation circuit that determines whether each of a set of multiple power sources is available; and
storing the state of the input/output pad enables the state to be retrieved from the latching circuit upon the processing unit switching from the sleep mode to an active mode.

13. The device of claim 12, wherein:
the power evaluation circuit comprises a counter block and a counter bypass block;
signals from the set of multiple power sources are input to an and gate that is coupled to the counter block; and
a bypass instruction signal is input to the counter bypass block to enable bypassing the counter block.

14. The device of claim 13, wherein an output of the counter block and an output of the counter bypass block are connected as inputs to an or gate.

15. The device of claim 11, wherein:
the power-state processing circuit comprises a second latching circuit;
the second latching circuit accepts the power availability signal to set the second latching circuit, the power availability signal indicating whether each of a set of multiple power sources is available; and
the second latching circuit accepts a second signal to reset the second latching circuit, the second signal indicating whether a specific voltage power source is available.

16. The device of claim 15, wherein:
the second latching circuit generates an output that is connected as an input to an and gate that generates a control signal for operating the latching circuit; and
the power-state processing circuit inverts the control signal to create a second control signal for further operating the latching circuit.

17. The device of claim 16, wherein assertion of the output of the second latching circuit disables at least one programmable pin that is coupled to the input/output pad.

18. The device of claim 11, wherein:
the latching circuit comprises a first latch for storing an enabling signal; and
the latching circuit comprises a second latch for storing a data signal that corresponds to the enabling signal.

19. The device of claim 11, wherein:
the power-state processing circuit and the latching circuit are disposed on a general-purpose input/output;
the general-purpose input/output comprises a first voltage domain and a second voltage domain; and
the general-purpose input/output comprises a driver that converts an output from the first voltage domain to the second voltage domain.

20. A system comprising:
a processing unit;
a power evaluation circuit that is configured to:
determine whether each of a set of multiple power sources is available and send a delayed power availability signal;
generate a power-state signal; and
bypass a delay of the delayed power availability signal by asserting a non-delayed power availability signal in response to the processing unit exiting a low-power-state;
a general-purpose input/output that comprises:
a power-state processing circuit that is configured to receive the power-state signal indicating whether a processing unit is entering the low-power-state; and
a latching circuit that is configured to:
couple the processing unit to an input/output pad;
respond to the power-state signal indicating that the processing unit is entering the low-power-state by storing a state of a data signal at the input/output pad; and
respond to the non-delayed power availability signal by restoring the state of the data signal at the input/output pad.

* * * * *